(12) United States Patent
Xiong et al.

(10) Patent No.: US 11,609,456 B2
(45) Date of Patent: Mar. 21, 2023

(54) DISPLAY PANEL AND MANUFACTURING METHOD THEREOF

(71) Applicant: TCL CHINA STAR OPTOELECTRONICS TECHNOLOGY CO., LTD., Guangdong (CN)

(72) Inventors: Pengpeng Xiong, Guangdong (CN); Tianhong Wang, Guangdong (CN)

(73) Assignee: TCL CHINA STAR OPTOELECTRONICS TECHNOLOGY CO., LTD., Guangdong (CN)

( * ) Notice: Subject to any disclaimer, the term of this patent is extended or adjusted under 35 U.S.C. 154(b) by 53 days.

(21) Appl. No.: 16/960,742

(22) PCT Filed: Apr. 28, 2020

(86) PCT No.: PCT/CN2020/087617
§ 371 (c)(1),
(2) Date: Jul. 8, 2021

(87) PCT Pub. No.: WO2021/184498
PCT Pub. Date: Sep. 23, 2021

(65) Prior Publication Data
US 2022/0350186 A1 Nov. 3, 2022

(30) Foreign Application Priority Data
Mar. 18, 2020 (CN) .......................... 202010190313.3

(51) Int. Cl.
G02F 1/1339 (2006.01)
G02F 1/1335 (2006.01)
G03F 7/00 (2006.01)

(52) U.S. Cl.
CPC ...... *G02F 1/13396* (2021.01); *G02F 1/13398* (2021.01); *G02F 1/133516* (2013.01); *G03F 7/0007* (2013.01); *G02F 1/13394* (2013.01)

(58) Field of Classification Search
CPC .......... G02F 1/13396; G02F 1/133516; G02F 1/13398; G02F 1/13394; G03F 7/0007
(Continued)

(56) References Cited

U.S. PATENT DOCUMENTS

| | | | |
|---|---|---|---|
| 6,734,945 | B2 | 5/2004 | Nakayoshi et al. |
| 2010/0110022 | A1* | 5/2010 | Chen ..................... G06F 3/0412 345/173 |

(Continued)

FOREIGN PATENT DOCUMENTS

| | | |
|---|---|---|
| CN | 106597759 A | 4/2017 |
| CN | 107589597 A | 1/2018 |

(Continued)

*Primary Examiner* — Charles S Chang
(74) *Attorney, Agent, or Firm* — PV IP PC; Wei Te Chung; Ude Lu

(57) ABSTRACT

A display panel and a manufacturing method thereof are provided. The display panel includes a first substrate, a second substrate, and a liquid crystal layer; a carrier of the first substrate includes a plurality of carriers, a spacer layer of the second substrate includes a plurality of spacers, each carrier disposed corresponds to each spacer, wherein the carrier comprises a base and at least one sub-carrier disposed on the base. The present disclosure adopts different thickness of the carriers to form a step difference, thereby relieving surface pressure of the display panel and saving manufacturing cost.

18 Claims, 3 Drawing Sheets

(58) Field of Classification Search
USPC .................................................. 349/155–157
See application file for complete search history.

(56) References Cited

U.S. PATENT DOCUMENTS

2018/0284516 A1* 10/2018 Kobayashi ........ G02F 1/133345
2019/0129223 A1   5/2019 Huang et al.
2020/0089032 A1*  3/2020 Huang .................. G03F 7/0007
2020/0103569 A1   4/2020 Wu

FOREIGN PATENT DOCUMENTS

| CN | 109031772 A | 12/2018 |
| CN | 109143692 A | 1/2019 |
| CN | 109507827 A | 3/2019 |
| CN | 208705625 U | 4/2019 |
| CN | 209417486 U | 9/2019 |

* cited by examiner

DISPLAY PANEL AND MANUFACTURING METHOD THEREOF

FIELD OF INVENTION

The present disclosure relates to the field of display technology, and more particularly, to a display panel and manufacturing method thereof.

BACKGROUND OF INVENTION

In the field of liquid crystal displays (LCDs), gap control materials are required to support a display panel, in a bid to prevent damage to the display panel when the display panel is subjected to external pressure.

In the prior art, the display panel is protected by changing heights of spacers of the gap control materials and using different height spacers to form a step difference. However, manufacturing price of photomasks of the spacers is high and manufacturing process thereof is complicated, leading to high cost.

Therefore, a display panel and a manufacturing method thereof are urgently required to solve the above technical problems.

SUMMARY OF INVENTION

The present disclosure provides a display panel and a manufacturing method thereof to solve the technical problems in the prior art that the expensive manufacturing price of photomasks of the spacers and complicated manufacturing process causes a high cost.

To solve the above problems, the technical solutions provided by the present disclosure are as follows:

A display panel, wherein the display panel including: a first substrate, a second substrate opposite to the first substrate, and a liquid crystal layer between the first substrate and the second substrate;
  the first substrate comprises a first base substrate and a carrier layer disposed on the first base substrate, and the carrier layer comprises a plurality of carriers; and
  the second substrate comprises a second base substrate and a spacer layer disposed on the second base substrate, the spacer layer comprises a plurality of spacers, wherein each carrier disposed corresponds to each spacer;
  wherein each carrier portion comprises a base and at least one sub-carrier disposed on the base, an orthographic projection of the sub-carrier on the base disposed in the base.

In the display panel of the present disclosure, in a direction from the first substrate to the second substrate, an orthographic projection area of the sub-carrier on the base is gradually decreased.

In the display panel of the present disclosure, the carrier at least comprises a first sub-carrier on the base and a second sub-carrier on the first sub-carrier;
  wherein an orthographic projection area of the second sub-carrier projected on the base is smaller than an orthographic projection area of the first sub-carrier projected on the base.

In the display panel of the present disclosure, a thickness of the sub-carrier away from the first base substrate is less than a thickness of the sub-carrier close to the first base substrate.

In the display panel of the present disclosure, the first substrate further comprises a color film layer between the first base substrate and the carrier layer;
  wherein any one of the carriers is composed of at least one of a red color resist, a green color resist, or a blue color resist of the color film layer.

In the display panel of the present disclosure, a thickness of the carrier ranges from 1 μm to 2 μm.

In the display panel of the present disclosure, a distance between the carrier and the corresponding spacer is less than 1 μm.

In the display panel of the present disclosure, a cross-sectional area of the sub-carrier on a first cross section is greater than or equal to 144 μm$^2$, and the first cross section is parallel to the display panel.

In the display panel of the present disclosure, a cross-sectional area of the base on a first cross section is not more than 500 μm$^2$, and the first cross section is parallel to the display panel.

In the display panel of the present disclosure, a material of the carrier comprises a color resist or a photo resist.

A manufacturing method of a display panel, including following steps:
  sequentially forming a plurality of bases and at least one sub-carrier on the bases on a first base substrate;
  forming a plurality of spacers on a second base substrate, wherein one base corresponds to one spacer; and
  aligning a side of the first base substrate where the sub-carrier is formed and a side of the second base substrate where the spacer is formed;
  wherein an orthographic projection of the sub-carrier on the base is disposed in the base, at least one base and at least one sub-carrier constitute a carrier, and at least one spacer constitutes a spacer layer.

In the manufacturing method of the display panel of the present disclosure, the step of sequentially forming the plurality of bases and the at least one sub-carrier on the base on the first base substrate comprises:
  forming a color resist layer on the first base substrate; and
  patterning the color resist layer with a first photomask to form the plurality of bases and the at least one sub-carrier on the base;
  wherein in a direction from a first substrate to a second substrate, an orthographic projection area of the sub-carrier on the base is gradually decreased.

In the manufacturing method of the display panel of the present disclosure, a pattern of the first photomask corresponding to any of the carriers comprises a central shading area, and at least one annular shading area surrounding the central shading area to form a plurality of carriers comprising the plurality of bases and a plurality of sub-carriers.

In the manufacturing method of the display panel of the present disclosure, the steps of forming the plurality of bases and at least one sub-carrier includes:
  performing exposure and development processes by the first photomask to form the plurality of bases and at least one first sub-carrier on the at least one base and at least one second sub-carrier on the at least one first sub-carrier;
  wherein an orthographic projection area of the second sub-carrier projected on the base is smaller than an orthographic projection area of the first sub-carrier projected on the base.

In the manufacturing method of the display panel of the present disclosure, the step of forming the at least one sub-carrier includes:

using the first photomask to perform exposure and development processes to form the plurality of sub-carriers;
wherein a thickness of the sub-carrier away from the first base substrate is less than a thickness of the sub-carrier close to the first base substrate.

In the method for manufacturing the display panel of the present disclosure, any one of the carriers is composed of at least one of a red color resist, a green color resist, or a blue color resist of a color film layer.

In the manufacturing method of the display panel of the present disclosure, a thickness of the carrier ranges from 1 μm to 2 μm.

In the manufacturing method of the display panel of the present disclosure, a distance between the carrier and the corresponding spacer is less than 1 μm.

In the manufacturing method of the display panel of the present disclosure, a cross-sectional area of the sub-carrier on the first cross section is greater than or equal to 144 μm$^2$, and the first cross section is parallel to the display panel.

In the manufacturing method of the display panel of the present disclosure, a cross-sectional area of the base on a first cross section is not more than 500 μm$^2$, and the first cross section is parallel to the display panel.

The present disclosure adopts different thicknesses of the carriers to form the step difference between the spacer and the corresponding carrier, relieving the surface pressure of the display panel, saving manufacturing cost, and increasing productivity.

DETAILED DESCRIPTION OF PREFERRED EMBODIMENTS

The present disclosure provides a display panel and a manufacturing method thereof. In order to make the purpose that the technical solutions and effects of the present disclosure specific and clear, the present disclosure will be described in further detail below with reference to the accompanying figures and embodiments. It should be understood that the specific embodiments described herein are only used to explain the present disclosure, and are not intended to limit the present disclosure.

Figure 1:
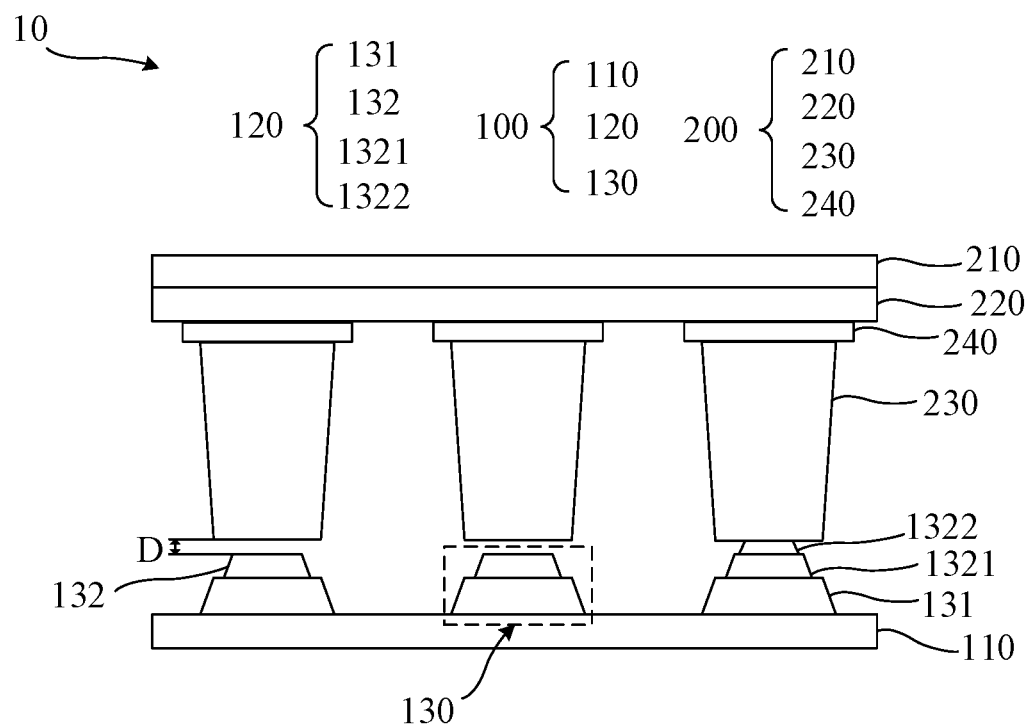
FIG. 1 is a schematic diagram of a display panel structure of the present disclosure.
Figure 2:
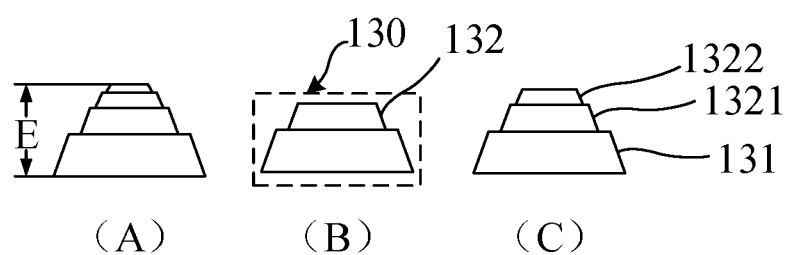
FIG. 2 is a schematic diagram of a partial structure of the display panel of the present disclosure.

Please refer to FIGS. 1 and 2. The present disclosure proposes a display panel 10 including a first substrate 100, a second substrate 200 opposite to the first substrate 100, and a liquid crystal layer between the first substrate 100 and the second substrate 200.

The first substrate 100 includes a first base substrate 110 and a carrier layer 120 disposed on the first base substrate 110, and the carrier layer 120 includes a plurality of carriers 130.

The second substrate 200 includes a second base substrate 210 and a spacer layer disposed on the second base substrate 210, the spacer layer includes a plurality of spacers 230 having the same thickness, wherein one carrier 130 corresponds to one spacer 230.

Each carrier 130 includes a base 131 and at least one sub-carrier 132 disposed on the base 131, and an orthographic projection of the sub-carrier 132 on the base 131 is disposed in the base 131.

The present disclosure adopts different thicknesses of the carriers to form the step difference between the spacer and the corresponding carrier, relieving the surface pressure of the display panel, saving manufacturing cost, and increasing productivity.

The technical solution of the present disclosure will be described in combination with specific embodiments.

Please refer to FIGS. 1 and 2, the display panel 10 including a first substrate 100, a second substrate 200 opposite to the first substrate 100, and a liquid crystal layer between the first substrate 100 and the second substrate 200.

The first substrate 100 includes a first base substrate 110 and a carrier layer 120 disposed on the first base substrate 110, and the carrier layer 120 includes a plurality of carriers 130.

The second substrate 200 includes a second base substrate 210 and a spacer layer disposed on the second base substrate 210, the spacer layer includes a plurality of spacers 230 having the same thickness, wherein one carrier 130 corresponds to one spacer 230.

Each of the carriers 130 includes a base 131 and at least one sub-carrier 132 disposed on the base 131, and an orthographic projection of the sub-carrier 132 on the base 131 is disposed in the base 131.

In one embodiment, the thicknesses of any two of the spacers 230 are the same.

In one embodiment, the second substrate further includes a color film layer 220 between the second base substrate 210 and the spacer layer. Please refer to FIG. 1 for details.

In one embodiment, the second substrate 200 further includes a black matrix layer between the color film layer 220 and the spacer layer, the black matrix layer includes a plurality of black matrices 240, and one black matrix 240 corresponds to one of the spacers 230. An orthographic projection of the spacer 230 on the second substrate 200 is in an orthographic projection corresponding to the black matrix 240 on the second substrate 200. Please refer to FIG. 1 for details.

Figure 3:
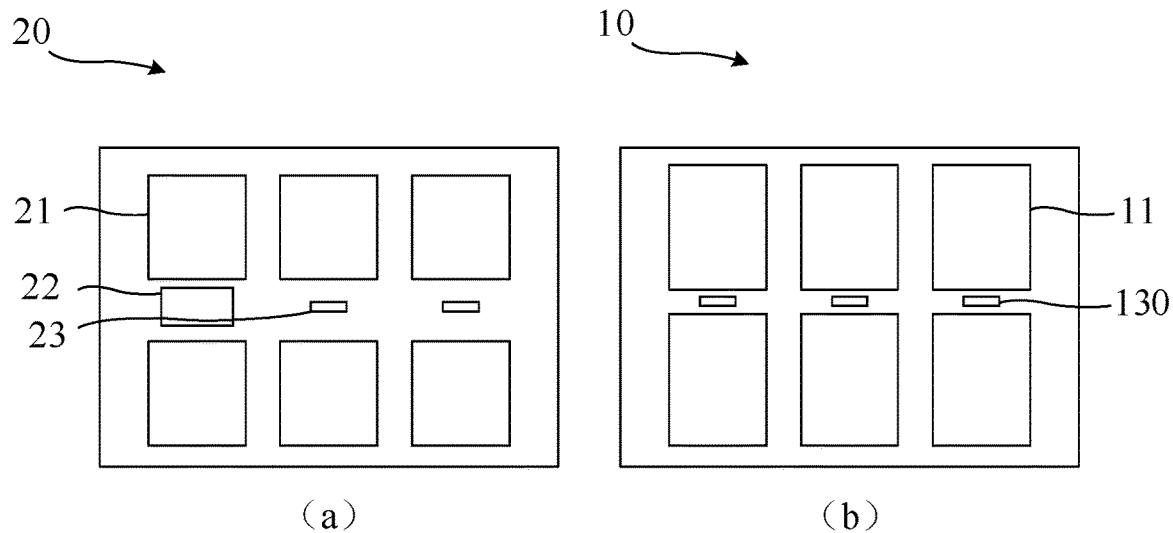
FIG. 3 is a schematic top diagram of the display panel structure of the present disclosure compared with a structure of the prior art.

In one embodiment, the carrier layer 120, the black matrix layer, and the spacer layer are disposed in a non-display area of the display panel 10. Since in the prior art, the main spacer has a large contact area with the display panel, by eliminating the main spacer in the prior art and therefore reducing the contact area between the spacer and the non-display area, the area of the non-display area is reduced, thereby increasing the pixel aperture ratio of the display panel and improving the display effect. Please refer to FIG. 3, wherein a is the prior art, a plurality of main spacers 22 and auxiliary spacers 23 are provided between two adjacent sub-pixel regions 21 of the existing display panel 20, and b is a technical solution of the present disclosure that provides a plurality of spacers 130 between two adjacent sub-pixel regions 11 of the display panel 10.

In one embodiment, in a direction from the first substrate 100 to the second substrate 200, an orthographic projection area of the sub-carrier 132 on the base 131 gradually decreases, please refer to FIG. 1 and FIG. 2, wherein A, B, and C in FIG. 2 are schematic structural examples of three carriers 130.

In one embodiment, the carrier 130 includes at least a first sub-carrier 1321 on the base 131 and a second sub-carrier 1322 on the first sub-carrier 1321. An orthographic projection area of the second sub-carrier 1322 on the base 131 is smaller than an orthographic projection area of the first sub-carrier 1321 on the base 131, please refer to FIG. 1 and FIG. 2 for details.

In one embodiment, a thickness of the sub-carrier 132 away from the first base substrate 110 is less than a thickness of the sub-carrier 132 close to the first base substrate 110. For details, please refer to FIGS. 1 and 2. When the display panel 10 is squeezed, the sub-carrier 132 away from the first base substrate 110 is squeezed first and compressed toward the sub-carrier 132 close the first base substrate 110. As a force receiving area increases, a pressure on the carrier decreases, and a pressure on the panel also decreases. At the same time, resilience and support of the carrier increase, which is conducive to rebound, strengthening overall resilience of the display panel while protecting the display panel.

In one embodiment, a material of the carrier 130 includes color resist or photo resist.

In one embodiment, the first substrate 100 further includes a color film layer 220 between the first base substrate 110 and the carrier layer, wherein any one of the carriers 130 is composed of at least one of a red color resist, a green color resist, or a blue color resist of the color film layer 220, and the color and composition of the color resist are not limited herein.

In one embodiment, any one of the bases 131 is composed of at least one of a red color resist, a green color resist, or a blue color resist of the color film layer 220, and the color and composition of the color resist are not limited herein.

In one embodiment, any one of the sub-carriers 132 is composed of at least one of a red color resist, a green color resist, or a blue color resist of the color film layer 220, and the color and composition of the color resist are not limited herein.

In one embodiment, a thickness E of the carrier 130 ranges from 1 µm to 2 µm. For details, please refer to FIGS. 1 and 2, while the carrier 130 and the corresponding spacer 230 form a step difference, a step difference of the formation is guaranteed, also ensuring the stability of the carrier 130, and preventing the panel 10 from being squeezed and the phenomenon of breakage and overturning that may occur when the carrier 130 is compressed.

In one embodiment, a distance D between the carrier 130 and the corresponding spacer 230 is less than 1 µm. For details, please refer to FIG. 1 and FIG. 2, a step difference is formed by different height carriers 130 and the corresponding spacer 230, when the display panel is pressed, the carrier 130 can be compressed, and there is a compression space with the step difference to protect the display panel.

In one embodiment, a cross-sectional area of the sub-carrier 132 on the first cross-section is greater than or equal to 144 µm$^2$, the first cross section is parallel to the display surface of the display panel 10, and a cross-sectional area of the sub-carrier 132 on the first cross-section is too small, causing excessive pressure on the display panel and resulting in poor display when the display panel is pressed and when the spacer 230 contacts the sub-carrier 132.

In one embodiment, a cross-sectional area of the base 131 on the first cross section is not more than 500 µm$^2$, the first cross section is parallel to the display surface of the display panel 10, and a cross-section area of the base 131 on the first cross-section is too large, causing an aperture ratio of the display area to be occupied, resulting in a decrease in the aperture ratio and waste of effective display area.

In one embodiment, carriers with different thicknesses are used to form a step difference between the spacer and the corresponding carrier, thereby relieving the surface pressure of the display panel, saving manufacturing costs, and improving productivity.

The present disclosure also provides a manufacturing method of a display panel, the manufacturing method of the display panel 10 includes:

S10: Sequentially forming a plurality of bases 131 and at least one sub-carrier 132 on the base 131 on a first base substrate 110;

S20: Forming a plurality of spacers 230 on a second base substrate 210, wherein one base 131 corresponds to one spacer 230;

S30: Aligning a side of the first base substrate 110 where the sub-carrier 132 is formed and a side of the second base substrate 210 where the spacer 230 is formed;

S40: An orthographic projection of the sub-carrier 132 on the base 131 is disposed in the base 131, at least one base 131 and at least one sub-carrier 132 constitute a carrier 130, and at least one spacer 230 constitutes a spacer layer.

In the present disclosure, different thickness of the carrier and same thickness of the spacers are used to form a step difference between the spacer and the corresponding carrier, thereby relieving the surface pressure of the display panel, saving the manufacturing cost, and improving the productivity.

The technical solutions of the present disclosure will be described in combination with specific embodiments.

Figure 4:
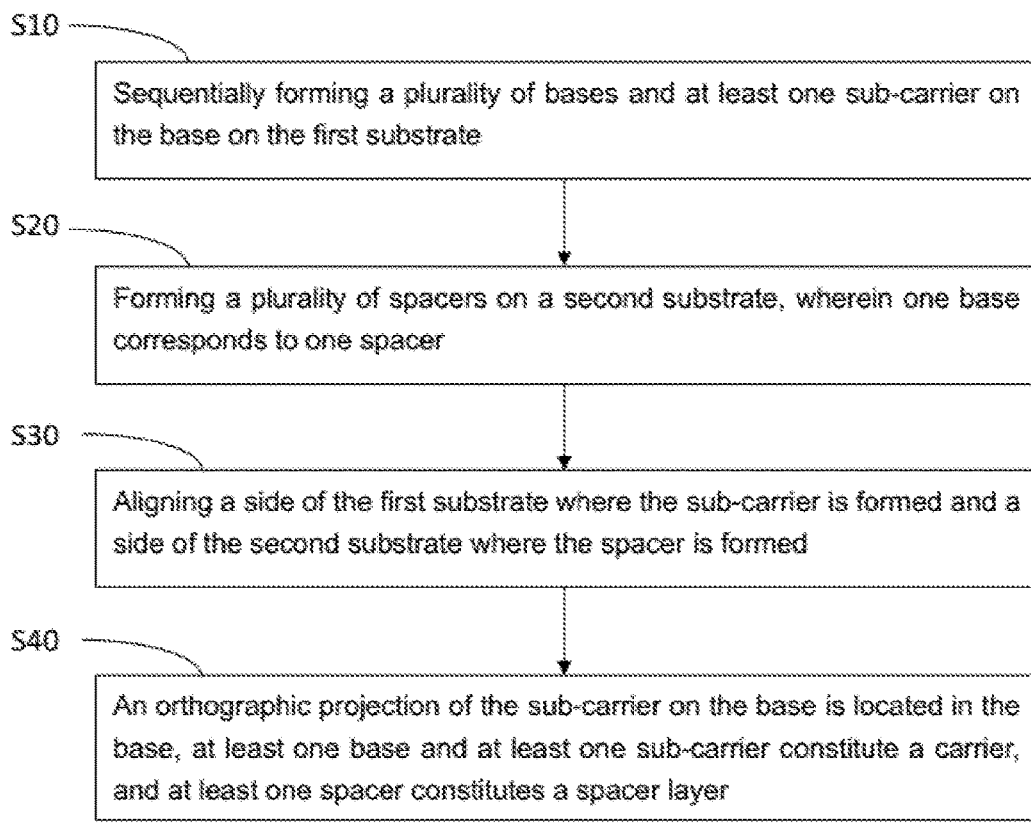
FIG. 4 is a flowchart of steps of a manufacturing method of the display panel of the present disclosure.

Referring to FIG. 4, the manufacturing method of the display panel 10 includes:

S10: Sequentially forming a plurality of bases 131 and at least one sub-carrier 132 on the base 131 on the first base substrate 110.

In one embodiment, step S10 includes:

S11: Forming a color resist layer on the first base substrate 110.

In one embodiment, the color resist layer may be formed to include a transparent area and a non-transparent area, the transparent area is a pixel definition area, and the non-transparent area is a non-light-emitting area between the pixel definition areas. The carrier layer 120, the black matrix layer, and the spacer layer are disposed in a non-light emitting area between the non-transparent area and the pixel defining area.

S12: Patterning the color resist layer with a first photomask to form the plurality of bases 131 and at least one sub-carrier 132 disposed on the base 131.

In one embodiment, the patterning process includes manufacturing processes of exposing and developing the color resist layer by the first photomask.

S13: In a direction from the first base substrate 110 to the second base substrate 210, an orthographic projection area of the sub-carrier 132 on the base 131 gradually decreases.

In one embodiment, the S10 further includes:

S11: Forming a plurality of color resist layer on the first base substrate 110. The plurality of color resist layer includes any combination of two or three of a red color resist, a blue color resist, or a green color resist.

S12: Patterning the color resist layer with a first photomask to form the plurality of bases 131 and at least one sub-carrier 132 on the base 131.

In one embodiment, the patterning process includes manufacturing processes of exposing and developing the color resist layer by the first photomask.

S13: In a direction from the first base substrate 110 to the second base substrate 210, an orthographic projection area of the sub-carrier 132 on the base 131 gradually decreases.

In one embodiment, step S12 further includes:

A thickness of the sub-carrier 132 away from the first substrate 100 is less than a thickness of the sub-carrier 132 close to the first substrate 100 respectively. Please refer to FIGS. 1 and 2 for details.

In one embodiment, step S12 using the first photomask to perform exposure and development processes to form a plurality of bases 131 and a first sub-carrier 1321 on the base 131 and a second sub-carrier 1322 on the first sub-carrier 1321, please refer to FIGS. 1 and 2 for details. An orthographic projection area of the second sub-carrier 1322 on the base 131 is smaller than an orthographic projection area of the first sub-carrier 1321 on the base 131.

Figure 5:
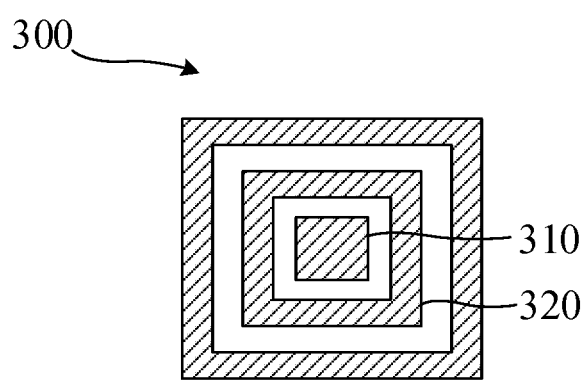
FIG. 5 is a schematic diagram of a photomask pattern of the manufacturing method of the display panel of the present disclosure.

In one embodiment, a pattern of the first photomask 300 corresponding to any one of the carriers 130 includes a central shading area 310 and at least one annular shading area 320 surrounding the central shading area. For details, please refer to FIG. 5, the annular shading area 320 has the same light transmittance, so the first mask 300 is cheap, utilizes the diffraction of light, and controls the height and light intensity of the exposure machine to form the plurality of carriers 130 that include the plurality of bases 131 and the plurality of sub-carriers 132. For example, the carrier 130 as shown in C of FIG. 2 can be formed by using the mask pattern of FIG. 5.

In one embodiment, a thickness E of the carrier 130 ranges from 1 μm to 2 μm.

For details, please refer to FIGS. 1 and 2, while the carrier 130 and the corresponding spacer 230 form a step difference, a step difference of the formation is guaranteed, also ensuring the stability of the carrier 130, and preventing the panel 10 from being squeezed and the phenomenon of breakage and overturning that may occur when the carrier 130 is compressed.

In one embodiment, step S10 includes:

S11: Forming a color resist layer on the first base substrate 110.

In one embodiment, the color resist layer may be the color film layer 220. When the color resist layer may be the color film layer 220, step S21 may be omitted, and subsequent steps are adjusted accordingly.

In one embodiment, when the color resist layer may be the color film layer 220, the first photomask may be a partial pattern of the photomask patterning the color film layer 220.

In one embodiment, the color resist layer may be formed to include a transparent area and a non-transparent area, the transparent area is a pixel definition area, and the non-transparent area is a non-light-emitting area between the pixel definition areas. The carrier layer 120, the black matrix layer, and the spacer layer are disposed in a non-light emitting area between the non-transparent area and the pixel defining area.

S12: Patterning the color resist layer with a first photomask to form the plurality of bases 131 and at least one sub-carrier 132 located on the bases 131.

In one embodiment, the patterning process includes manufacturing processes of exposing and developing the color resist layer by the first photomask.

In one embodiment, any one of the carriers 130 is composed of at least one of a red color resist, a green color resist, or a blue color resist of the color film layer 220, and the color and composition of the color resist are not limited herein.

In one embodiment, any one of the bases 131 is composed of at least one of a red color resist, a green color resist, or a blue color resist of the color film layer 220, and the color and composition of the color resist are not limited herein.

In one embodiment, any one of the sub-carriers 132 is composed of at least one of a red color resist, a green color resist, or a blue color resist of the color film layer 220, and the color and composition of the color resist are not limited herein.

In one embodiment, a cross-sectional area of the sub-carrier 132 on the first cross-section is greater than or equal to 144 $\mu m^2$, the first cross section is parallel to the display surface of the display panel 10, and a cross-sectional area of the sub-carrier 132 on the first cross-section is too small, causing excessive pressure on the display panel and resulting in poor display when the display panel is pressed and when the spacer 230 contacts the sub-carrier 132.

In one embodiment, a cross-sectional area of the base 131 on the first cross section is not more than 500 $\mu m^2$, the first cross section is parallel to the display surface of the display panel 10, and a cross-section area of the base 131 on the first cross-section is too large, causing an aperture ratio of the display area to be occupied, resulting in a decrease in the aperture ratio and waste of effective display area.

S20: Forming a plurality of spacers 230 on a second base substrate 210, wherein one base 131 corresponds to one spacer 230, please refer to FIG. 1 and FIG. 2 for details.

In one embodiment, step S20 includes:

S21: Forming a color film layer 220 on the second base substrate 210.

S22: Forming a spacer layer on the color film layer 220.

In one embodiment, the material of the spacer layer is composed of photoresist.

In one embodiment, step S22 includes:

S221: Forming a black matrix layer on the color film layer 220.

S222: Forming a plurality of black matrices 240 by performing the exposure and development processes to the black matrix layer.

S23: The spacer layer is exposed and developed to form a plurality of spacers 230. One base 131 corresponds to one spacer 230. Please refer to FIGS. 1 and 2 for details.

In one embodiment, a plurality of spacers 230 having the same thickness are formed on the plurality of black matrixes 240, one black matrix 240 corresponds to one spacer 230, and one base 131 corresponds to one spacer 230. Please refer to FIGS. 1 and 2 for details.

S30: Aligning a side of the first base substrate 110 where the sub-carrier 132 is formed and a side of the second base substrate 210 where the spacer 230 is formed.

In one embodiment, the carrier layer 120, the black matrix layer, and the spacer layer are disposed in a non-display area of the display panel 10. Since in the prior art, the main spacer has a large contact area with the display panel, by eliminating the main spacer in the prior art and therefore reducing the contact area between the spacer and the non-display area, the area of the non-display area is reduced, thereby increasing the pixel aperture ratio of the display panel and improving the display effect. Please refer to FIG. 3, wherein a is the prior art, a plurality of main spacers 22 and auxiliary spacers 23 are provided between two adjacent sub-pixel regions 21 of the existing display panel 20, and b is a technical solution of the present disclosure that provides a plurality of spacers 130 between two adjacent sub-pixel regions 11 of the display panel 10

In one embodiment, when the first base substrate 110 is aligned with the second base substrate 210, at least one of the spacers 230 is in contact with the corresponding carrier 130, and a distance D between the carrier 130 and the corresponding spacer 230 is less than 1 µm. For details, please refer to FIG. 1 and FIG. 2, a step difference is formed by different height carriers 130 and the corresponding spacer 230, when the display panel is pressed, the carrier 130 can be compressed, and there is a compression space with the step difference to protect the display panel.

S40: An orthographic projection of the sub-carrier 132 on the base 131 is disposed in the base 131, at least one base 131 and at least one sub-carrier 132 constitute a carrier 130, and at least one the spacer 230 constitutes a spacer layer, please refer to FIGS. 1 and 2 for details.

In one embodiment, between step S30 and step S40 further includes:

S400: Forming a liquid crystal layer between the first base substrate 110 and the second base substrate 210.

The embodiments of the present disclosure, through using common photomasks to form carriers with different thicknesses, and subsequently form a step difference between the spacer and the corresponding carrier, improves the surface pressure of the display panel, increases the resilience of the display panel, saves manufacturing cost, and increases the productivity.

In summary, the present disclosure discloses a display panel and a manufacturing method thereof. The display panel includes a first substrate, a second substrate opposite to the first substrate, and a liquid crystal layer between the first substrate and the second substrate; the first substrate includes a first base substrate and a carrier layer disposed on the first base substrate, and the carrier layer comprises a plurality of carriers; the second substrate comprises a second base substrate and a spacer layer disposed on the second base substrate, and the spacer layer comprises a plurality of spacers, wherein each carrier disposed corresponds to each spacer; wherein each carrier portion comprises a base and at least one sub-carrier disposed on the base, and an orthographic projection of the sub-carrier on the base is disposed in the base. The present disclosure adopts different thickness of the carriers to form the step difference between the spacer and the corresponding carrier, relieving the surface pressure of the display panel, saving manufacturing cost, and increasing productivity.

It can be understood that for those of ordinary skill in the art, equivalent replacements or changes can be made according to the technical solutions and inventive steps of the present disclosure, and all such changes or replacements should fall within the protection scope of the claims appended to the present disclosure.

What is claimed is:

1. A display panel, comprising:
a first substrate, a second substrate disposed opposite to the first substrate, and a liquid crystal layer between the first substrate and the second substrate;
wherein the first substrate comprises a first base substrate and a carrier layer disposed on the first base substrate, and the carrier layer comprises a plurality of carriers;
the second substrate comprises a second base substrate and a spacer layer disposed on the second base substrate, and the spacer layer comprises a plurality of spacers, wherein any two of the spacers are of a same thickness, and each carrier is disposed corresponding to one of the spacers;
wherein each carrier comprises a base and at least one sub-carrier disposed on the base; and in each carrier, an orthographic projection of each of the at least one sub-carrier projected on the base is within an area of the base, and an area of the orthographic projection of each of the at least one sub-carrier projected on the base gradually decreases in a direction from the first substrate to the second substrate; and
wherein in each carrier, a thickness of any of the at least one sub-carrier away from the first base substrate is less than a thickness of any of the at least one sub-carrier closer to the first base substrate.

2. The display panel as claimed in claim 1, wherein the carrier at least comprises a first sub-carrier on the base and a second sub-carrier on the first sub-carrier;
wherein an orthographic projection area of the second sub-carrier projected on the base is smaller than an orthographic projection area of the first sub-carrier projected on the base.

3. The display panel as claimed in claim 1, wherein the first substrate further comprises a color film layer between the first base substrate and the carrier layer;
wherein any one of the carriers is composed of at least one of a red color resist, a green color resist, or a blue color resist of the color film layer.

4. The display panel as claimed in claim 1, wherein a thickness of the carrier ranges from 1 µm to 2 µm.

5. The display panel as claimed in claim 1, wherein a distance between the carrier and the corresponding spacer is less than 1 µm.

6. The display panel as claimed in claim 1, wherein a cross-sectional area of the sub-carrier on a first cross section is greater than or equal to 144 µm$^2$, and the first cross section is parallel to the display panel.

7. The display panel as claimed in claim 1, wherein a cross-sectional area of the base on a first cross section is not more than 500 µm$^2$, and the first cross section is parallel to the display panel.

8. The display panel as claimed in claim 1, wherein a material of the carrier comprises a color resist or a photo resist.

9. A manufacturing method of a display panel, comprising following steps:
sequentially forming a plurality of bases and a plurality of sub-carriers on the bases on a first base substrate, wherein at least one of the sub-carriers is disposed on each of the bases;
forming a plurality of spacers on a second base substrate, wherein each of bases is disposed corresponding to one of the spacers, wherein any two of the spacers are of a same thickness; and
aligning in a face-to-face relationship a side of the first base substrate where the sub-carriers are formed with a side of the second base substrate where the spacers are formed;
wherein in each carrier, an orthographic projection of each of the at least one sub-carrier projected on the base is within an area of the base, and an area of the orthographic projection of each of the at least one sub-carrier projected on the base gradually decreases in a direction from the first substrate to the second substrate;
wherein each base and the at least one sub-carrier on the base constitute a carrier, and the spacers constitute a spacer layer.

10. The manufacturing method of the display panel as claimed in claim 9, wherein the step of sequentially forming the bases and the sub-carriers on the bases on the first base substrate comprises:
forming a color resist layer on the first base substrate; and patterning the color resist layer with a first photomask to form the bases and the at least one sub-carrier on each of the bases.

11. The manufacturing method of the display panel as claimed in claim 10, wherein a pattern of the first photomask corresponding to any of the carriers comprises a central shading area, and at least one annular shading area surrounding the central shading area to form a plurality of carriers comprising the plurality of bases and a plurality of sub-carriers.

12. The manufacturing method of the display panel as claimed in claim 10, wherein the step of forming the plurality of bases and the at least one sub-carrier comprises:
performing exposure and development processes by the first photomask to form the plurality of bases and at least one first sub-carrier on the at least one base and at least one second sub-carrier on the at least one first sub-carrier;
wherein an orthographic projection area of the second sub-carrier projected on the base is smaller than an orthographic projection area of the first sub-carrier projected on the base.

13. The manufacturing method of the display panel as claimed in claim 10, wherein the step of forming the at least one sub-carrier on each of the bases comprises:
using the first photomask to perform exposure and development processes to form the sub-carriers on the first base substrate;
wherein in each carrier, a thickness of any of the at least one sub-carrier away from the first base substrate is less than a thickness of any of the at least one sub-carrier closer to the first base substrate.

14. The manufacturing method of the display panel as claimed in claim 10, wherein any one of the carriers is composed of at least one of a red color resist, a green color resist, or a blue color resist of a color film layer.

15. The manufacturing method of the display panel as claimed in claim 9, wherein a thickness of each of the carriers ranges from 1 µm to 2 µm.

16. The manufacturing method of the display panel as claimed in claim 9, wherein a distance between each of the carriers and the corresponding one of the spacers is less than 1 µm.

17. The manufacturing method of the display panel as claimed in claim 9, wherein a cross-sectional area of the sub-carrier on a first cross section is greater than or equal to 144 µm$^2$, and the first cross section is parallel to the display panel.

18. The manufacturing method of the display panel as claimed in claim 9, wherein a cross-sectional area of the base on a first cross section is not more than 500 µm$^2$, and the first cross section is parallel to the display panel.

* * * * *